Nov. 18, 1969 W. FREER 3,479,622

MULTI-COMPARTMENT TUNER CONSTRUCTION FACILITATING ELECTROMAGNETIC HIGH-FREQUENCY COUPLING AND MINIMIZING ELECTROSTATIC LOW-FREQUENCY COUPLING

Filed April 11, 1966

INVENTOR.
WALTER FREER
BY
ATTORNEY 3,479,622

MULTI-COMPARTMENT TUNER CONSTRUCTION FACILITATING ELECTROMAGNETIC HIGH-FREQUENCY COUPLING AND MINIMIZING ELECTROSTATIC LOW-FREQUENCY COUPLING

Walter Freer, Derry, N.H., assignor to General Instrument Corporation, Newark, N.J., a corporation of New Jersey Filed Apr. 11, 1966, Ser. No. 541,725
Int. Cl. H03j 3/02; H01p 7/06
U.S. Cl. 334—85 9 Claims

ABSTRACT OF THE DISCLOSURE

In a high-frequency tuner having an iris window in a wall between tuning sections, the provision of a plurality of conductive fingers extending across the iris window, the fingers being electrically connected at one end and disconnected at the other end, providing for appropriate electromagnetic coupling at high frequencies, while at low frequencies coupling is minimized.

The present invention relates to a tuner having tuning sections separated by a partition, the partition being so constructed as to provide for a desired degree of electromagnetic couplings at high frequencies and to prevent coupling between the tuning sections at other frequencies.

High-frequency tuning units conventionally are divided into compartments by partitions, with different tuning sections being provided in the different compartments. Means must be provided for electrically connecting the tuning sections to one another in a manner appropriate to the overall operation of the tuner. For example, one tuning section may be connected to the antenna, while another tuning section may be connected to the mixer circuit. The coupling between those two sections is desired only with regard to signals at high or radio frequencies, but any signals at lower frequencies, such as those at the intermediate frequency of the tuner, should not be coupled from one tuning section to another for optimum operation.

One very convenient and prevalent method for coupling of radio frequency signals is to provide an iris opening in the partition, the size of that opening producing the desired degree of electromagnetic couplings at the frequencies of the tuned circuits. A disadvantage of the use of the iris opening is that it also permits undesirable coupling from one tuning section to another of signals at frequencies other than the frequencies of the tuned circuits.

It is the prime object of the present invention to devise a structure which, without adversely affecting the electromagnetic coupling of desired radio frequencies to any appreciable extent, will effectively minimize the coupling of other signals, such as those at lower frequencies, and which accomplishes this result simply and inexpensively, in a fashion well adapted to quantity production.

To that end the tuner shield which is provided with a coupling window is also provided, extending across that window, with a plurality of conductive fingers which are electrically connected to one another and to ground at one end thereof and which are electrically separated from one another at their other end. The fingers are relatively narrow compared with the width of the iris opening across which they extend, and for that reason, and because they are electrically insulated at one end, they are essentially transparent to radio frequency signals. Thus they do not appreciably adversely affect the electromagnetic coupling of the desired high frequency signals. However, to signals at lower frequencies the fingers function as an electrostatic or capacative shield, thus preventing the passage of such undesired signals from one tuning section to the next. The fingers defining the electrostatic shield may well be formed integrally with the partition, and by the same forming operation which cuts the partition from sheet material and produces the iris opening itself. Consequently the electrostatic shield is formed in a most inexpensive manner and functions in a most reliable manner.

To the accomplishment of the above, and to such other objects as may hereinafter appear, the present invention relates to the construction of a tuner having a pair of tuning sections separated from one another by a partition, the partition structure being such as to provide for electromagnetic coupling at high frequencies and electrostatic shielding at low frequencies, as defined in the appended claims and as described in this specification, taken together with the accompanying drawings, in which:

Figure 1:
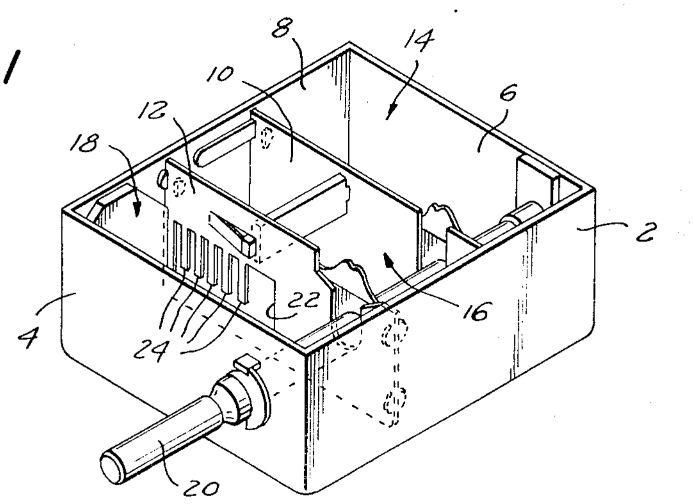
FIG. 1 is a three-quarter perspective view of a typical UHF tuner constructed in accordance with the present invention, the conventional circuit elements thereof being omitted in order better to illustrate the present invention.

The tuner comprises a conductive housing comprising a front wall 2, side walls 4 and 6 and a rear wall 8. A pair of conductive partitions 10 and 12 extend between the front and rear walls 2 and 8 respectively and are electrically connected to those walls. The partitions 10 and 12 divide the tuner into three sections 14, 16 and 18, which are shielded from one another by means of the partitions 10 and 12 respectively. The tuner sections 14–18 conventionally comprise coaxial line cavities, the individual coaxial lines being tunable by means of movable tuning elements located in each of the sections 14 and 18 and mounted on tuning shaft 20 for movement relative to cooperating fixed portions of the coaxial lines in each of the tuner sections. The coaxial line structure and the actual variable tuning structure may take a wide variety of forms, are relatively conventional, form no part of the present invention, and therefore are not here specifically illustrated.

The circuitry in the tuner sections 14–18 must be electrically connected or coupled to one another in order for the tuner to function. As here illustrated the present invention is incorporated into the coupling structure active between the tuning sections 16 and 18 which may, by way of example, contain the antenna circuitry and the mixer circuitry respectively. Radio frequency coupling between the antenna and mixer circuits is desired, but signals at lower frequencies, such as at the intermediate frequency of the tuning system, should not be coupled from one tuner section to the other for best results. High-frequency coupling is conventionally effected in a simple manner by providing, in the partition 12, a window 22 of appropriate areal extent, electromagnetic radiation from the antenna circuit passing through the window 22 and electromagnetically affecting the mixer circuit, constituting one of the inputs thereto. While the iris window 22 thus provides for coupling of high frequency signals, it also tends to permit appreciable inter-section coupling of signals at lower frequencies, such as those at the intermediate frequency, and this gives rise to undesirable reception effects.

In accordance with the present invention a plurality of fingers or tines 24 are provided which are formed of electrically conductive material, are electrically grounded at one end, and are electrically disconnected from one another at their other end. Thus fingers or tines 24 extend at least partway across the window 22. Because the fingers 24 are narrow there is little opportunity for eddy currents to be induced therein in response to the radio frequency signals passing through the window 22; they therefore are essentially transparent to such high frequency signals. In the case of lower frequency signals, however, the fingers 24 function as a capacitive or electrostatic shield between, for example, the antenna coil in one of the tuner sections and the diode loop and intermediate frequency coil in the adjacent tuner section. As a result the adjacent tuner sections 16 and 18 are effectively insulated from one another insofar as such low frequency signals are concerned, and coupling of such signals from one of the tuner sections to the other is greatly minimized. Because of the essential transparency of the fingers 24 to the radio frequency signals which are to be electromagnetically coupled, they do not affect that electromagnetic coupling, and consequently the area of the iris window 22 requires no appreciable modification because of the existence of the fingers 24.

It would be possible to provide individual fingers 24 and attach them to the partition 12 so that they were electrically connected to that partition at one end and electrically separated therefrom at the other end. The fingers 24 could extend all the way across the window 22, so long as means were provided to insulate the fingers from the partition 12 and from one another at one end. However, since the partition 12 is generally formed from conductive sheet material by a stamping or punching operation, it is most convenient and most economical to form the fingers 24 integrally with the remainder of the partition 12 in a single stamping or cutting operation, in which case, and as is here specifically disclosed, the fingers 24 are electrically connected to one another and to the partition 12 at one end by being integral with the partition 12 at that end, the other ends of the fingers 24 being electrically disconnected from one another and from the partition 12 by terminating short of the opposite edge of the window 22.

Figure 2:
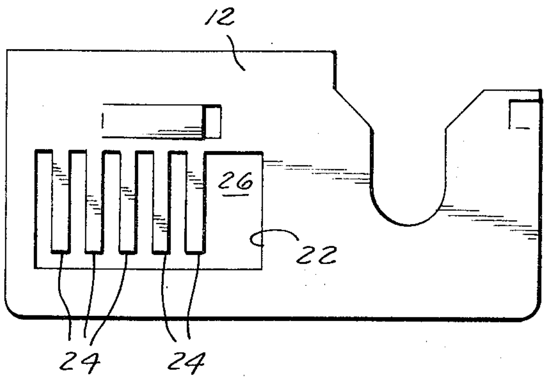
FIG. 2 is a front elevational view of a partition of the tuner of FIG. 1.
Figure 3:
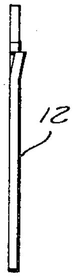
FIG. 3 is an end elevational view taken from the right hand end of the partition of FIG. 2.
Figure 4:
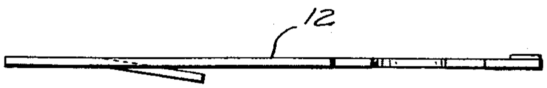
FIG. 4 is a top plan view of the partition of FIG. 2.

It will be noted from an examination of FIGS. 1 and 2 that the fingers 24 are relatively uniformly spaced from one another and that they are located off-center with regard to the width of the window 22, a window area 26 being provided at the right hand end of the window 22, as viewed in FIG. 2, which is considerably wider than the space between individual fingers 24. This arrangement does not appreciably adversely affect the electrostatic shielding produced by the fingers 24, and it provides appropriate space through which tools may be passed, thereby facilitating assembly and adjustment of the complete tuner.

While but a single embodiment of the present invention has been here specifically disclosed, it will be apparent that many variations may be made therein, all within the scope of the instant invention as defined in the following claims.

I claim:

1. In a UHF tuner comprising a housing having a pair of tuning sections separated from one another by a partition and adapted to be electromagnetically coupled to one another; the improvement which comprises said partition being formed of electrically conductive material and having an iris window therethrough, and a plurality of conductive fingers laterally spaced from one another, electrically connected at one end to said partition, extending from one edge of said window at least partially across said window and being at their other end electrically unconnected to said partition.

2. The tuner of claim 1, in which said fingers are integral with said partition.

3. The tuner of claim 2, in which the overall size of said window is such as to produce the desired degree of electromagnetic coupling between adjacent sections, the said fingers each having a width many times smaller than the width of said window.

4. The tuner of claim 2, in which the overall size of said window is such as to produce the desired degree of electromagnetic coupling between adjacent sections, the said fingers each having a width many times smaller than the width of said window, said fingers being arranged so that they, together with the spaces therebetween, collectively cover a substantial portion of the width of said window, another portion of the width of said window which is considerably wider than said fingers being free of said fingers.

5. The tuner of claim 1, in which said fingers are integral with said partition and physically terminate at their said other end at points spaced from the opposite edge of said window.

6. The tuner of claim 5, in which the overall size of said window is such as to produce the desired degree of electromagnetic coupling between adjacent sections, the said fingers each having a width many times smaller than the width of said window.

7. The tuner of claim 5, in which the overall size of said window is such as to produce the desired degree of electromagnetic coupling between adjacent sections, the said fingers each having a width many times smaller than the width of said window, said fingers being arranged so that they, together with the spaces therebetween, collectively cover a substantial portion of the width of said window, another portion of the width of said window which is considerably wider than said fingers being free of said fingers.

8. The tuner of claim 1, in which the overall size of said window is such as to produce the desired degree of electromagnetic coupling between adjacent sections, the said fingers each having a width many times smaller than the width of said window.

9. The tuner of claim 1, in which the overall size of said window is such as to produce the desired degree of electromagnetic coupling between adjacent sections, the said fingers each having a width many times smaller than the width of said window, said fingers being arranged so that they, together with the spaces therebetween, collectively cover a substantial portion of the width of said window, another portion of the width of said window which is considerably wider than said fingers being free of said fingers.

References Cited

UNITED STATES PATENTS

| | | | |
|---|---|---|---|
| Re. 23,534 | 8/1952 | Varian | 333—83 X |
| 2,341,345 | 2/1944 | Billiard | 334—85 X |
| 2,476,034 | 7/1949 | Fox. | |
| 2,739,287 | 3/1956 | Riblet | 333—10 X |
| 2,740,094 | 3/1956 | Fox. | |
| 3,226,645 | 12/1965 | Harwood et al. | 334—85 X |

OTHER REFERENCES

Collin, R.E., "Foundations for Microwave Engineering," McGraw-Hill, 1966, pp. 219–220, TK7870C46.

HERMAN KARL SAALBACH, Primary Examiner

Wm. H. PUNTER, Assistant Examiner

U.S. Cl. X.R.

333—73, 83; 325—357, 445